March 12, 1968 R. W. POLLEY ET AL 3,372,474

SYSTEM FOR WELDABLE CIRCUITS

Filed Nov. 8, 1963

INVENTORS:

ROBERT W. POLLEY

ROBERT W. TABOR

BY [signature]

United States Patent Office 3,372,474
Patented Mar. 12, 1968

3,372,474
SYSTEM FOR WELDABLE CIRCUITS

Robert W. Polley and Robert W. Tabor, Nashua, N.H., assignors to Sanders Associates, Inc., Nashua, N.H., a corporation of Delaware Filed Nov. 8, 1963, Ser. No. 322,461
7 Claims. (Cl. 29—626)

This invention relates to a method of producing printed circuits, which circuits rely on electrical connection to electrical components by means of fastening the components to a preformed protruding tab present in the circuit.

More specifically, this invention relates to a method of producing printed circuits in which the problem of connector tab protection and cleanliness is solved by the unique application to a portion of the circuit of a temporary host matrix material.

In the past, the production of printed circuitry in which there was a need to weld, solder or otherwise fasten components thereto was complicated by the difficulty in fastening the components thereto because the surfaces to be joined were not clean. The degree of cleanliness involved being critical to the production of a sound joint. The smallest amounts of impurities or dirt at the points of electrical contact brought about severe burning and electrode wear during the welding step and caused difficulty during soldering.

In the past, the printed circuit involved was made by conventional techniques and then portions of the circuit which were bonded to the substrate insulating material were lifted in such a manner that these conductor portions were at right angles to a surface of the printed circuit board. This was accomplished by either the manual lifting of these conductor portions from the base material or in the alternative, by punching an opening in the back side of the circuit board and thereby causing the selected conductor portion to be raised and bent into a vertical position. This last mentioned technique as well as the earlier invariably presented conductor portions to be welded which were relatively dirty, that is, speaking from the standpoint of making an electrical conductor joint between a component and the conductor. These small vertical extensions then required minute manual cleansing to insure freedom from any surface impurity brought about during the original laminating steps. Furthermore, these extensions caused great difficulty during production in that extensive precautions had to be taken to prevent damage to them.

All of the above noted problems have been removed by the application of the method to be described hereafter.

Accordingly, an object of this invention is the production of electrical circuits with raised weldable tabs which are totally free from surface impurities.

Another object of the invention is the provision of raised circuit tabs which may be welded or soldered to components and which remain vertical in position during all phases of the circuit formation.

Another object of this invention is the provision of a unique protective matrix layer of material to guard and protect raised circuit tab portions during subsequent circuit laminations and processing.

Still another object of this invention is the provision of a unique multilayer circuit arrangement which utilizes raised circuit portions of different lengths to thereby interconnect multilayer laminations and related electrical components.

Another object of this invention resides in the provision of a time and labor saving method of preserving printed circuit conductor portions free of surface contaminants which thereby enhances a construction of single and multilayer printed circuit arrangements.

Other objects of this invention will in part be obvious and will in part appear thereafter.

For a fuller understanding of the nature and objects of the invention, reference should be had to the following detailed description taken in connection with the accompanying drawings in which.

Figures 1, 2, 3, 4, 5, 6, 7, 8, 9, 10, 11:
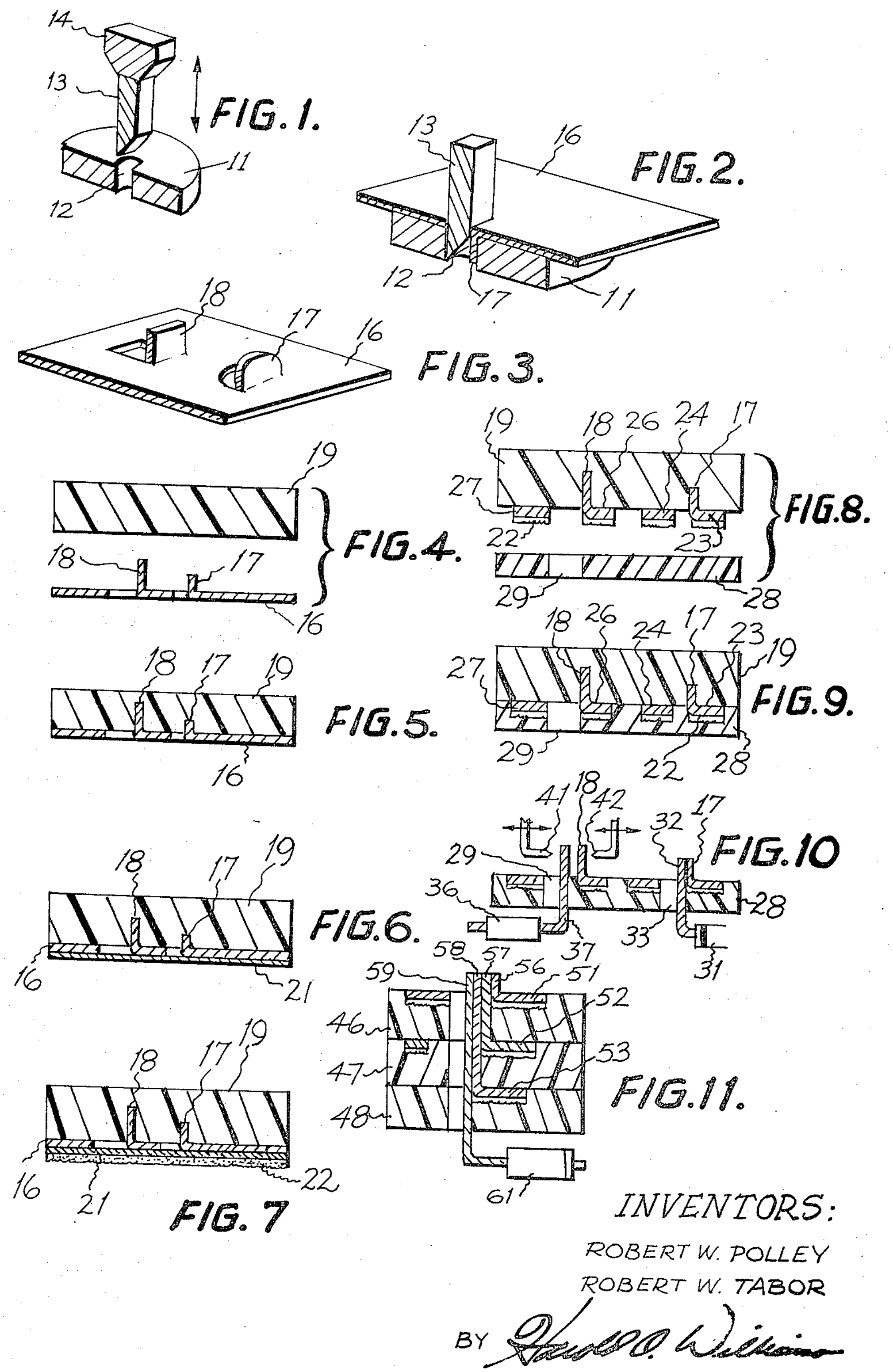
FIG. 1 depicts schematically a punched and die arrangement.
FIG 2 illustrates the punched and die for FIG. 1 and its cooperation with a layer of foil.
FIG. 3 shows a perspective view or several forms of preformed circuit tabs.
FIG. 4 is a showing of a protective matrix layer of material superimposed on a prepunched conductor foil.
FIG. 5 illustrates the maxtrix material shown in FIG. 4 bonded to the prepunched foil.
FIG. 6 is a cross section of the multilayer laminate shown in FIG. 5 with an additional layer of metal bonded thereto.
FIG. 7 shows a cross section of FIG. 6 wherein the metal foil has been treated.
FIG. 8 shows a cross section of an etched circuit laminate superimposed over a prepunched insulating base.
FIG. 9 depicts a laminated article including the insulating base bonded to a circuit configuration.
FIG. 10 is a cross-sectional view of a printed circuit and related electrical components.
FIG. 11 illustrates an embodiment of this invention shown in section in which a multilayer arrangement is illustrated.

Referring now to FIG. 1, there is illustrated a female die block 11 in which there is a female die opening 12. Directly above the female die opening 12 is the male punched cutting tip 13 and the male punched cutting tip 13 is shown schematically attached to a punched cutting tip holder 14.

Referring now to FIG. 2, there is shown a sheet of metal foil 16 which has just experienced a punching operation in which the male punched cutting tip 13 has been driven through the metal foil 16 into the female die opening 12 and in so doing has bent the circuit connector tab 17 into a vertical position as a result of the shearing action of the cutting tip 13 on the foil 16.

In the preferred embodiment to be discussed more fully thereafter, the metal involved is nickel. It should be recognized that applicants' contribution, of course, is not meant to be limited to the use of nickel sheet, but any suitable sheet or foil which may have a suitable physical characteristic which enhances subsequent welding or soldering operations.

Referring now to FIG. 3, the layer of metal sheet or foil 16 has protruding from the surface thereof a bent circuit connector tab 17 which has a half-moon configuration. Also shown in FIG. 3 for illustrative purposes is a second bent circuit connector tab 18 rectangular in shape and longer than the half-moon connector tab 17. The tabs may be of any size or configuration. While these connector tabs 17 and 18 have been shown as relatively large tabs for purposes of illustrating and dramatizing their configurations and relative heights, in reality, their dimensions in many instances are less than .024 of an inch in height and represent very small protuberances. Their small size is a significant factor in the prior art problem when the step of cleaning these small protrusions was entered into. Furthermore, the need of maintaining their relative positions so they will conform with other components was also an important factor.

Referring now to FIG. 4, it will be seen here that an insulating matrix material 19 has been superimposed over sheet 16 and related connector tabs 17 and 18. In order that the sheet 16, which in the embodiment described herein is made of nickel, be bonded to the matrix material 19, the surface of sheet 16 must be treated to provide a suitable bonding surface for the insulating material. This is accomplished by immersing the foil or sheet 16 in a suitable etching bath to provide a roughened surface to the nickel sheet 16. This roughened surface of sheet 16, while not shown in the drawing, is important from the standpoint of the bond that is eventually to occur as shown in FIG. 5 between the insulating matrix material 19 and metal sheet 16. The bond between these two layers must be sufficient to maintain the sheet in position during subsequent circuit formation when the need to etch the metal sheet to produce the circuit is undertaken. The bond between the matrix layer 19 and the sheet layer 16 acts to prevent the intrusion of plating and etching solutions during later process steps.

Referring now to FIG. 6, there is shown one embodiment of this invention which calls for the addition to the surface of the nickel of a thin layer of copper 21. This thin layer of copper 21 is utilized as a base material for subsequent treatment at which time a highly bondable surface is sought. This layer of copper material 21 may be electroplated on the metal foil 16 by conventional techniques. Once the layer of copper foil is in place, this copper layer 21 may be oxidized to produce a cupric oxided surface which has the property of bonding well to a large number of insulating plastic base materials.

As can be seen in FIG. 7, when the copper layer 21 is treated, a layer of cupric oxide 22 appears uniformly over the surface of the sheet. After this copper oxidizing step is accomplished, a circuit configuration may be silkscreened on the oxide surface in a manner that will provide for the ultimate location of bent connector tabs 17 and 18 as part of the circuit that will be formed by subsequent etching.

The arrangement shown in FIG. 8 shows how a plurality of etched conductor paths 23, 24, 26, and 27 may be formed. It is, of course, obvious that in the illustration set forth in FIG. 8, connector tabs 17 and 18 are shown as integral portions of etched conductor paths 23 and 26. The arrangement depicted in FIG. 8 is for purposes of illustration alone and shows but one arrangement in which the tabs 17 and 18 are employed.

FIG. 8 illustrates the locationing of a preformed insulating base 28 directly beneath the matrix and conductor path laminate. The preformed insulating base 28 also shows a punched opening 29 which may be prepositioned relative to connector tab 18 for a purpose that will become obvious as the description of the method is completed.

FIG. 9 shows the insulating matrix material 19 which has acted as host for the etched conductor paths and their related circuit tab portions bonded to the preformed insulating base 28. The cupric oxide coating 22 provides a highly bondable surface directly adjacent to the insulating plastic 28. This bond was accomplished by the application of heat and pressure to this laminate, although other methods of bonding such as the utilization of adhesives can be used. At this point of the method, the host matrix material 19 has served its function of protecting projecting tabs 17 and 18 and its need could be at an end. The removal of the insulating matrix layer 19 is accomplished depending on the choice of the circuit builder by peeling, or should the matrix material 19 be soluble, its removal may be accomplished by dipping the entire laminate into a dissolving solution. It should be recognized that while some applications will call for the removal of the host matrix layer 19, this layer may be left in position to afford protection to the tabs during subsequent shipping or storage.

FIG. 10 illustrates the finished circuit configuration in a cross-sectional view. It is noted that the insulating matrix 19 has been completely removed and projecting connector tabs 17 and 18 stand erect and free of any surrounding material. At this point, the function of the prepunched portion of the preformed insulating base 28 becomes obvious and it is seen that it provides an opening 29 through the circuit panel and allows the electrical connection of an electrical component 36 and its related electrical lead wire 37 through the circuit board. The electrical component lead wire 37 is bent and positioned through the board adjacent to the longer bent circuit connector tab 18.

Depicted schematically in a position adjacent to the electrical lead wire 37 and the connector tab 18 are shown welding electrodes 41 and 42 which are mounted for movement into contact with the lead wire 37 and the connector tab 18 to establish a weld therebetween. A finished weld is illustrated in FIG. 10 where an electrical component 31 and its lead wire 32 are shown in a welded position. In order that passage through the circuit board be accomplished in this last noted electrical connection, a punched or cut opening 33 is required. In some instances, the subsequent punching operation of the insulating base material may be preferable.

In circuit boards where connections are made to the top of the board from above, the opening 29 can be omitted.

Referring now to FIG. 11, there is shown another embodiment of the applicants' invention in which a plurality of connector tabs 56, 57, and 58 have been formed and these in turn form an integral part of electrical conducting paths 51, 52, and 53 which are bonded to a plurality of insulating layers 46, 47, and 48. It, therefore, becomes obvious that applicants' invention can find usage in multilayer circuitry in which circuit connectors which are to be welded externally to the laminate are required. Schematically shown welded to tab connectors 56, 57, and 58 is the electrical lead wire 59 from an electrical component 61.

While there has been hereinbefore described the best mode contemplated by the inventors in carrying out the invention, it will be apparent that many and various changes and modifications may be made with respect to the embodiments illustrated, without departing from the spirit of the invention. It will be understood, therefore, that all changes and modifications as fall fairly within the scope of the present invention, as defined in the appended claims, are to be considered as part of the present invention.

What is claimed is:

1. A method of making an electrical circuit article with a clean electrically connectable protruding terminal tab portion comprising the steps of:

(a) forming a protruding tab in a metal sheet, which tab is formed so as to be angularly disposed with respect to the plane of said sheet, (b) bonding a removable protective insulating matrix layer of material to said metal sheet to embed said protruding tab portion in said matrix material, (c) selectively removing portions of said metal sheet to establish a circuit configuration which includes said protruding tab portion as part of said circuit configuration, (d) bonding said circuit configuration and said matrix layer to an insulating base lamina so that said circuit configuration is intermediate said matrix layer and said base lamina, and (e) removing said protective insulating matrix layer to expose said tab portion which may then be interconnected to an electronic component.

2. The method set forth in claim 1 wherein the protruding tab is formed by punching said metal sheet to produce an opening in said sheet with the simultaneous formation of said tab portion.

3. The method set forth in claim 1 wherein said insulating matrix bond to said metal sheet is enhanced by roughening the surface of said metal sheet prior to the bonding of said insulating matrix layer to said metal sheet.

4. The method set forth in claim 1 wherein
(a) said circuit configuration is established by applying a circuit configuration of resist material on said metal sheet, and
(b) placing said metal sheet and insulating matrix in an etching solution to thereby selectively remove portions of said metal layer not protected by said resist material whereby a circuit configuration remains.

5. A method of making an electrical circuit article with a clean electrically connectable protruding terminal tab portion comprising the steps of:
(a) forming a protruding tab in a metal sheet by punching said metal sheet to produce an opening in said sheet with the simultaneous formation of said tab portion, which tab is angularly disposed with respect to the plane of said sheet,
(b) roughening said metal sheet's surface to thereby enhance the bonding quality of said surface,
(c) bonding a removable protective insulating matrix layer of material to said roughened surface of said metal sheet to thereby embed said protruding tab portion in said matrix material,
(d) applying a resist material in a predetermined circuit configuration to said metal sheet so that said tab portion is included in said circuit configuration,
(e) placing said metal sheet and insulating matrix in an etching solution to thereby selectively remove portions of said metal layer not protected by said resist material whereby a circuit configuration remains,
(f) bonding said circuit configuration and said matrix layer to an insulating base lamina so that said circuit configuration is intermediate said matrix layer and said base lamina, and (g) removing said protective insulating matrix layer to expose said tab portion which may then be interconnected to an electronic component.

6. The method set forth in claim 5 wherein said insulating base lamina beneath said opening is removed to provide an opening through said circuit cinfiguration and said insulating base to thereby facilitate electrical connections to said tab portion through said insulating base.

7. A storable electrical circuit article comprised of:
(a) a metal circuit configuration bonded to an insulating base lamina having a protruding tab portion integral with said circuit configuration and angularly disposed at an angle of less than 180° with respect to the plane thereof for subsequent electrical connection to a component, and
(b) a removable protective host sheet material surrounding said tab portion and completely covering said circuit configuration to thereby protect said tab portion and related circuit configuration during subsequent handling and storage.

References Cited

UNITED STATES PATENTS

| | | | |
|---|---|---|---|
| 3,024,151 | 3/1962 | Robinson | 29—155.5 X |
| 2,984,597 | 5/1961 | Hennes | 29—155.5 X |
| 3,129,280 | 9/1964 | Elarde | 29—155.5 X |
| 3,151,278 | 4/1964 | Elarde. | |

JOHN F. CAMPBELL, *Primary Examiner.*

R. W. CHURCH, *Assistant Examiner.*